United States Patent
Kim

(10) Patent No.: US 9,025,397 B2
(45) Date of Patent: May 5, 2015

(54) DATA WRITE CIRCUIT OF SEMICONDUCTOR APPARATUS

(71) Applicant: SK Hynix Inc., Icheon-si, Gyeonggi-do (KR)

(72) Inventor: Jae Il Kim, Icheon-si (KR)

(73) Assignee: SK Hynix Inc., Gyeonggi-do (KR)

(*) Notice: Subject to any disclaimer, the term of this patent is extended or adjusted under 35 U.S.C. 154(b) by 127 days.

(21) Appl. No.: 13/846,723

(22) Filed: Mar. 18, 2013

(65) Prior Publication Data
US 2014/0177357 A1 Jun. 26, 2014

(30) Foreign Application Priority Data

Dec. 24, 2012 (KR) .................. 10-2012-0151781

(51) Int. Cl.
*G11C 7/00* (2006.01)
*G11C 7/10* (2006.01)
*G11C 7/22* (2006.01)

(52) U.S. Cl.
CPC ............ *G11C 7/1012* (2013.01); *G11C 7/1078* (2013.01); *G11C 7/1087* (2013.01); *G11C 7/1093* (2013.01); *G11C 7/1096* (2013.01); *G11C 7/22* (2013.01); *G11C 7/222* (2013.01)

(58) Field of Classification Search
CPC ....... G11C 7/1078; G11C 7/22; G11C 7/1006
USPC .............................. 365/189.16, 189.05, 225.7
See application file for complete search history.

(56) References Cited

U.S. PATENT DOCUMENTS

| | | | | |
|---|---|---|---|---|
| 6,564,359 | B2* | 5/2003 | Saeki ............................ | 716/113 |
| 6,909,643 | B2* | 6/2005 | Kwean ......................... | 365/193 |
| 7,016,237 | B2* | 3/2006 | Lee et al. ................. | 365/189.05 |
| 8,305,821 | B2* | 11/2012 | Ware ....................... | 365/189.15 |

FOREIGN PATENT DOCUMENTS

| KR | 1020050046069 A | 5/2005 |
|---|---|---|
| KR | 100567908 B1 | 3/2006 |

* cited by examiner

*Primary Examiner* — Connie Yoha
(74) *Attorney, Agent, or Firm* — William Park & Associates Ltd.

(57) ABSTRACT

A data write circuit of a semiconductor apparatus includes a data path configured to receive a pattern signal and generate a first delayed pattern signal; a data strobe signal path configured to receive the pattern signal and generate a second delayed pattern signal; a data latch block configured to latch the first delayed pattern signal in response to the second delayed pattern signal, and output a resultant signal; and a control block configured to generate the pattern signal, and vary a delay time of the data path according to a result of comparing phases of a latched signal of the data latch block and the pattern signal.

21 Claims, 6 Drawing Sheets

Case where setup/hold delay is excessive

Case where setup/hold delay is insufficient

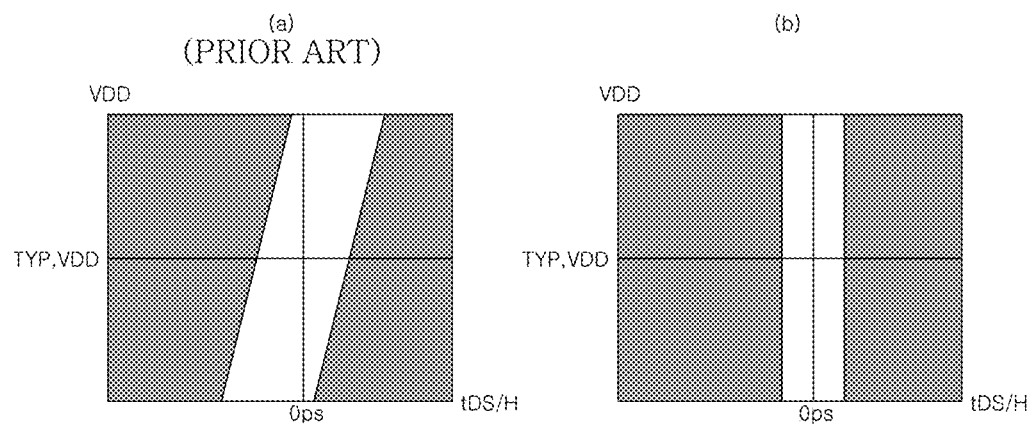

DATA WRITE CIRCUIT OF SEMICONDUCTOR APPARATUS

CROSS-REFERENCES TO RELATED APPLICATION

The present application claims priority under 35 U.S.C. §119(a) to Korean application number 10-2012-0151781, filed on Dec. 24, 2012, in the Korean Intellectual Property Office, which is incorporated herein by reference in its entirety.

BACKGROUND

1. Technical Field

Various embodiments generally relate to a semiconductor apparatus, and more particularly, to a data write circuit of a semiconductor apparatus.

2. Related Art

FIG. 1 is a block diagram showing a conventional data write circuit 1 of a semiconductor apparatus.

Referring to FIG. 1, the conventional data write circuit 1 of a semiconductor apparatus includes a plurality of pads DQS, DQSB and DQ0 to DQi, a plurality of buffers BUF, a plurality of setup/hold delays S/H DLY, a plurality of data latch blocks, and a plurality of data alignment blocks.

In the conventional art, a pair of data strobe signals DQS and DQSB are inputted through the plurality of pads DQS and DQSB, and the data is inputted through the plurality of pads DQ0 to DQi.

The data inputted through the plurality of pads DQ0 to DQi are transferred to the data latch blocks after being tuned in the delay times thereof through the plurality of respective setup/hold delays S/H DLY. Additionally, the data outputted through the plurality of pads DQ0 to DQi is received by buffers BUF, the buffers BUF also receiving a reference voltage VREF and outputting to the respective setup/hold delays S/H DLY.

The data latch blocks latch the data according to a pair of data strobe signals DQSR and DQSF respectively having passed through the buffers BUF. The data latch blocks include flip-flops DFF and a latch LATCH.

Thereafter, the data latched by the data latch blocks are aligned through the data alignment blocks.

The data strobe signal DQS is used as a signal for latching the data simultaneously inputted through the plurality of pads DQ0 to DQi.

Accordingly, since the load of the signal path of the data strobe signal DQS is larger than the load of the signal path of each of the plurality of pads DQ0 to DQi, a difference exists between the delay times of the two signal paths.

In the conventional art, in order to compensate for the difference between the delay times of the two signal paths, the plurality of setup/hold delays S/H DLY are configured.

However, while the load of the signal path of the data strobe signal DQS is owing to the RC component (resistance and capacitance component) of a signal line and the load of a gate logic, nearly most of the load of each of the setup/hold delays S/H DLY is owing to the load of a gate logic.

Therefore, if a variation occurs in PVT (process, voltage and temperature), a difference occurs between the delay of the signal path of the data strobe signal DQS and the delay of a data path, that is, the delay of the setup/hold delay S/H DLY which has a fixed value. Consequently, as write data setup/hold timing is lopsided, a problem is caused in that data write performance is likely to deteriorate.

SUMMARY

A data write circuit of a semiconductor apparatus which can enable stable data write even when a PVT variation occurs is described herein.

In an embodiment of the present invention, a data write is circuit of a semiconductor apparatus may include: a data path; a data strobe signal path; and a control block configured to vary a delay time of the data path according to a phase difference between a signal having passed through the data path and a signal having passed through the data strobe signal path.

In an embodiment of the present invention, a data write circuit of a semiconductor apparatus may include: a data path configured to receive a pattern signal and generate a first delayed pattern signal; a data strobe signal path configured to receive the pattern signal and generate a second delayed pattern signal; a data latch block configured to latch the first delayed pattern signal in response to the second delayed pattern signal, and output a resultant signal; and a control block configured to generate the pattern signal, and vary a delay time of the data path according to a result of comparing phases of a latched signal of the data latch block and the pattern signal.

In an embodiment of the present invention, the control block may be configured to generate a tune enable signal and generate the pattern signal in response to activation of the tune enable signal.

In an embodiment of the present invention, the control block may be configured to generate a tune enable signal and generate the pattern signal in response to activation of the tune enable signal, and is configured to generate delay control signals for varying the delay time of the data path according to a result of comparing the phases of the latched signal of the data latch block and the pattern signal.

BRIEF DESCRIPTION OF THE DRAWINGS

Features, aspects, and embodiments are described in conjunction with the attached drawings, in which:

FIG. 5 is a waveform diagram comparing setup/hold margins of the conventional art and the embodiments of the present invention.

DETAILED DESCRIPTION

Hereinafter, a data write circuit of a semiconductor apparatus according to the present invention will be described below with reference to the accompanying drawings through various embodiments.

Figure 1:
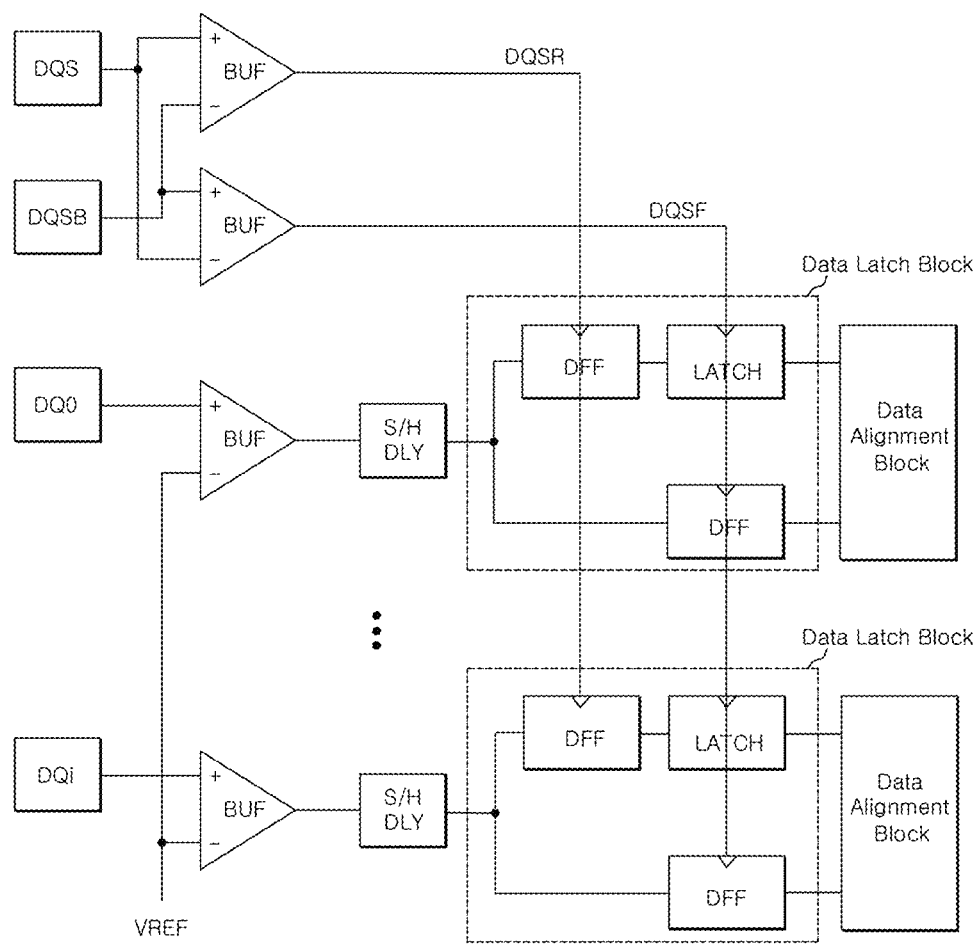
FIG. 1 is a block diagram showing a conventional data write circuit of a semiconductor apparatus.
Figure 2:
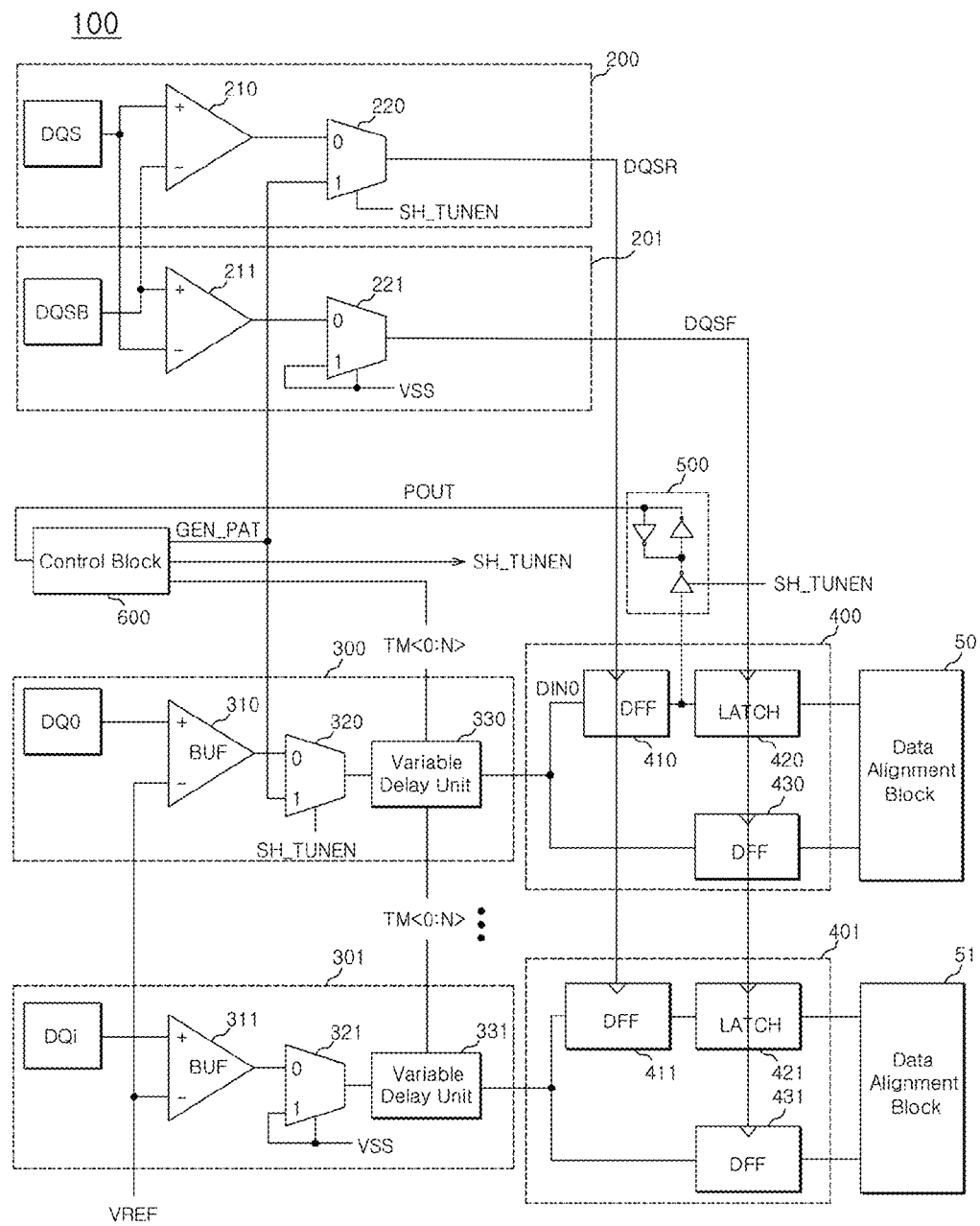
FIG. 2 is a block diagram showing a data write circuit of a semiconductor apparatus in accordance with an embodiment of the present invention.

FIG. 2 is a block diagram showing a data write circuit 100 of a semiconductor apparatus in accordance with an embodiment of the present invention.

Referring to FIG. 2, the data write circuit 100 of a semiconductor apparatus in accordance with the embodiments of the present invention may include a plurality of data strobe signal paths 200 and 201, a plurality of data paths 300 and 301, a plurality of data latch blocks 400 and 401, a plurality of data alignment blocks 50 and 51, a pattern signal switching block 500, and a control block 600.

The data strobe signal path 200 may include a pad DQS, a buffer 210, and a multiplexer 220.

The buffer 210 may be configured to buffer a data strobe signal DQS inputted through the pad DQS and output a resultant signal.

The multiplexer 220 may be configured to output the output signal of the buffer 210 or a pattern signal GEN_PAT in response to a tune enable signal SH_TUNEN.

The data strobe signal path 201 may include a pad DQSB, a buffer 211, and a multiplexer 221.

The buffer 211 may be configured to buffer a data strobe signal DQSB inputted through the pad DQSB and output a resultant signal.

The multiplexer 221, which serves as a component for allowing the data strobe signal path 201 to have the same delay as the data strobe signal path 200, may be configured to output the output signal of the buffer 211 by grounding the control signal terminal thereof (i.e., VSS).

The plurality of data paths 300 to 301 serve as components corresponding to the plurality of pads DQ0 to DQi. Only the components corresponding to the pads DQ0 and DQi are shown in the drawing.

The data path 300 may include a path DQ0, a buffer 310, a multiplexer 320, and a variable delay unit 330.

The buffer 310 may be configured to buffer the data inputted through the pad DQ0 and output a resultant signal.

The multiplexer 320 may be configured to output the output signal of the buffer 310 or the pattern signal GEN_PAT in response to the tune enable signal SH_TUNEN.

The variable delay unit 330 may be configured to delay the output of the multiplexer 320 by a varied delay time in response to delay control signals TM<0:N>.

The data path 301 may include a pad DQi, a buffer 311, a multiplexer 321, and a variable delay unit 331, and may be configured in the same manner as the data path 300. However, the multiplexer 321, which serves as a component for allowing the data path 301 to have the same delay as the data path 300, may be configured to output the output signal of the buffer 311 by grounding the control signal terminal thereof (i.e., VSS).

The delay times of all data paths, which correspond to the pads DQ1 to DQi and include the data path 301, are varied in response to the delay control signals TM<0:N>.

The data latch block 400 may be configured to latch the output signal of the data path 300 according to the output signals of the plurality of data strobe signal paths 200 and 201.

In the case where the tune enable signal SH_TUNEN is deactivated, that is, in a normal operation, a signal having passed through the data path 300 is data (for example, DIN0), and signals having passed through the data strobe signal paths 200 and 201 are a pair of data strobe signals DQSR and DQSF.

The data latch block 400 may include flip-flops 410 and 430, and a latch 420.

The flip-flop 410 may be configured to latch the output of the data path 300 according to the output of the data strobe signal path 200.

The latch 420 may be configured to latch the output of the flip-flop 410 according to the output of the data strobe signal path 201.

The flip-flop 430 may be configured to latch the output of the data path 300 according to the output of the data strobe signal path 201.

The data latch block 401 may include flip-flops 411 and 431, and a latch 421, and may be configured in the same manner as the data latch block 400.

The plurality of data alignment blocks 50 and 51 may be configured to align the outputs of the data latch blocks 400 and 401.

The pattern signal switching block 500 may be configured to receive and latch a latch signal POUT of the data latch block 400, that is, the output of the flip-flop 410, and provide the latch signal POUT to the control block 600, when the tune enable signal SH_TUNEN is activated.

The control block 600 may be configured to generate the tune enable signal SH_TUNEN, generate the pattern signal GEN_PAT in response to the activation of the tune enable signal SH_TUNEN, and generate the delay control signals TM<0:N> for varying the delay times of all the data paths including the data paths 300 and 301, according to a result of comparing the phases of the latch signal POUT of the data latch block 400 and the pattern signal GEN_PAT.

The physical position of the control block 600 is set such that the control block 600 may be positioned between one of all the data paths including the data paths 300 and 301, for example, the data path 300 including the pad DQ0, and the data strobe signal path 200.

This is to prevent a difference from occurring between the lengths of signal lines for transmitting the pattern signal GEN_PAT to the data path 300 and the data strobe signal path 200 from the control block 600.

In the case where the tune enable signal SH_TUNEN is activated, the pattern signal GEN_PAT may be inputted to the data path 300 and the data strobe signal path 200.

Accordingly, in the case where the tune enable signal SH_TUNEN is activated, the output signal of the data path 300 may be referred to as a first delayed pattern signal, and the output signal of the data strobe signal path 200 may be referred to as a second delayed pattern signal.

Figure 3:
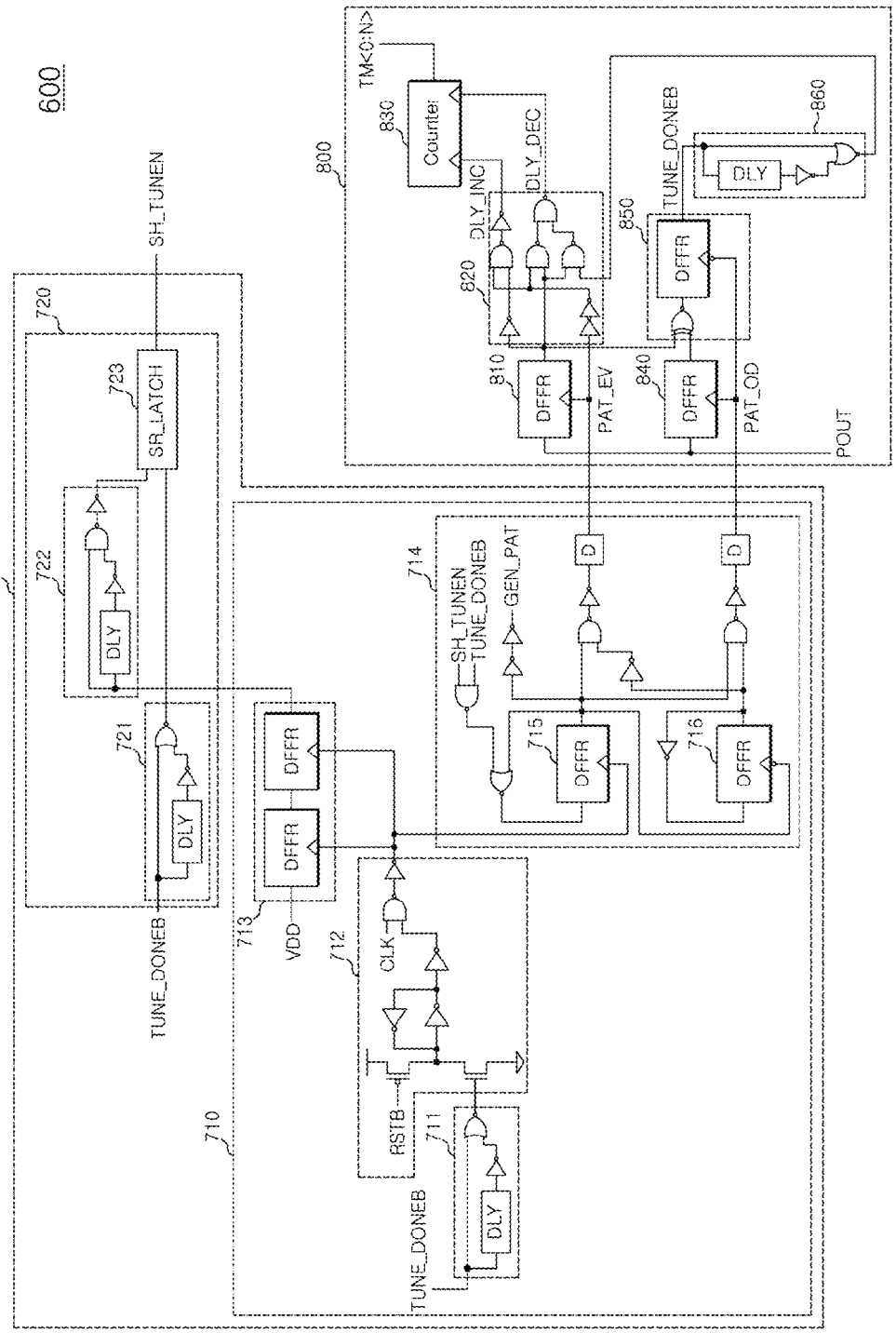
FIG. 3 is a circuit diagram showing the internal configuration of the control block of FIG. 2.

FIG. 3 is a circuit diagram showing the internal configuration of the control block 600 of FIG. 2.

The control block 600 may include a pattern signal generation unit 700 and a tuning unit 800.

The pattern signal generation unit 700 may be configured to generate the tune enable signal SH_TUNEN in response to a reset signal RSTB, and generate the pattern signal GEN_PAT and an even pattern signal PAT_EV and an odd pattern signal PAT_OD which are defined by differentiating the pattern signal GEN_PAT according to an order, by using the tune enable signal SH_TUNEN and a clock signal CLK.

The pattern signal generation unit 700 may include a pattern generating section 710 and a tune enable signal generating section 720.

The pattern generating section 710 may include a pulse generator 711 and a plurality of logic circuits 712 to 714.

The pulse generator 711 may be configured to generate a pulse signal in response to a tune completion signal TUNE_DONEB.

The logic circuit 712 may be configured to output the clock signal CLK when the reset signal RSTB is activated, and intercept the output of the clock signal CLK when the pulse signal is generated by is the pulse generator 711.

The logic circuit 713 may be configured to shift the level of a power supply voltage VDD according to the clock signal CLK outputted through the logic circuit 712 and output a resultant signal.

The logic circuit 714 may be configured to generate the pattern signal GEN_PAT, the even pattern signal PAT_EV and the odd pattern signal PAT_OD in the case where the tune enable signal SH_TUNEN is activated and the tune completion signal TUNE_DONEB is deactivated, that is, during a period in which tuning is performed. The logic circuit 714 may include a plurality of registers (DFFR) 715 and 716 and a plurality of logic devices.

The tune enable signal generating section 720 may include a plurality of pulse generators 721 and 722 and an SR latch 723.

The pulse generator 721 may be configured to generate a pulse signal in response to the tune completion signal TUNE_DONEB.

The pulse generator 722 may be configured to generate a pulse signal in response to the output of the logic circuit 713 of the pattern generating section 710.

The SR latch 723 may be configured to generate the tune enable signal SH_TUNEN in response to the respective pulse signals generated by the pulse generators 721 and 722.

The SR latch 723 activates the tune enable signal SH_TUNEN in response to the pulse signal of the pulse generator 722, and deactivates the tune enable signal SH_TUNEN in response to the pulse signal of the pulse generator 721.

The tuning unit 800 may be configured to compare the phases of the latch signal POUT of the data latch block 400, the even pattern signal PAT_EV and the odd pattern signal PAT_OD, and generate the delay control signals TM<0:N>.

The tuning unit 800 may include a plurality of registers (DFFR) 810 and 840, a counter control logic 820, a counter 830, a signal generation logic 850, and a pulse generator 860.

The register 810 may be configured to latch the latch signal POUT of the data latch block 400 according to the even pattern signal PAT_EV.

The counter control logic 820 may be configured to generate a counter value increase signal DLY_INC and a counter value decrease signal DLY_DEC in response to the output of the register 810.

The counter 830 may be configured to increase or decrease the value of the delay control signals TM<0:N> in response to the counter value increase signal DLY_INC and the counter value decrease signal DLY_DEC.

The register 840 may be configured to latch the latch signal POUT of the data latch block 400 according to the odd pattern signal PAT_OD.

The signal generation logic 850 may be configured to latch a result of XORing the output of the register 810 and the output of the register 840, according to an inverted signal of the odd pattern signal PAT_OD, and generate the tune completion signal TUNE_DONEB. Accordingly, the tune completion signal TUNE_DONEB is activated only in the case where the output of the register 810 and the output of the register 840 are different from each other.

The pulse generator 860 may be configured to generate a pulse signal in response to the tune completion signal TUNE_DONEB. FIG. 3 also depicts counter value circuits DLY.

A setup/hold delay tuning operation of the data write circuit 100 of a semiconductor apparatus in accordance with the embodiments of the present invention, configured as mentioned above, will be described below with reference to FIGS. 2 to 4b.

Figure 4A:
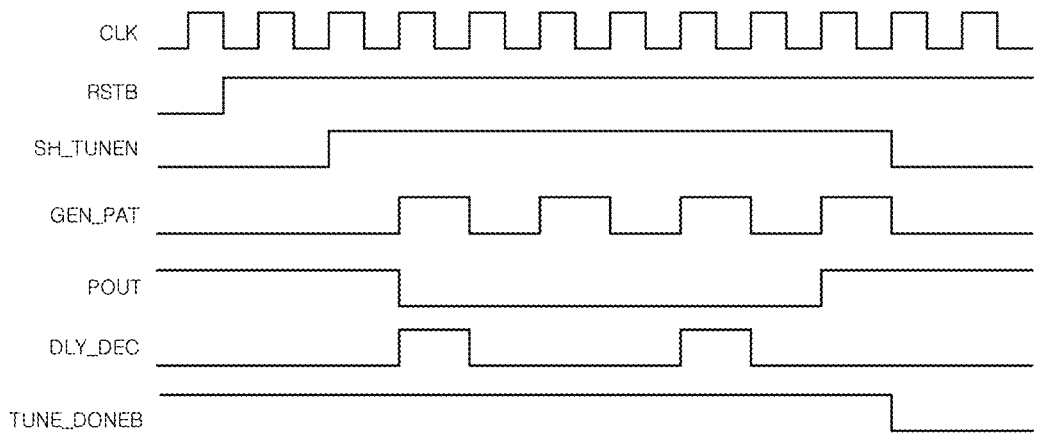
FIGS. 4a and 4b are operation timing diagrams of the data write circuit of a semiconductor apparatus in accordance with the embodiments of the present invention.
Figure 4A:
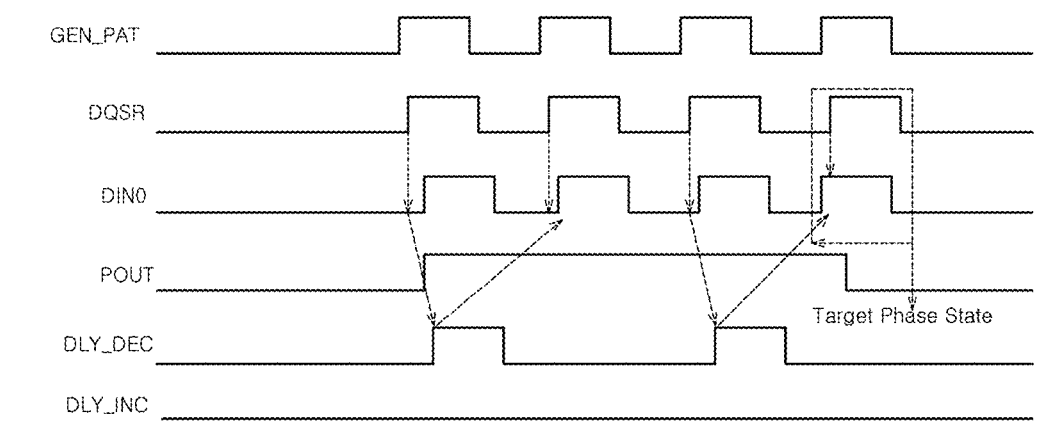
Figure 4B:
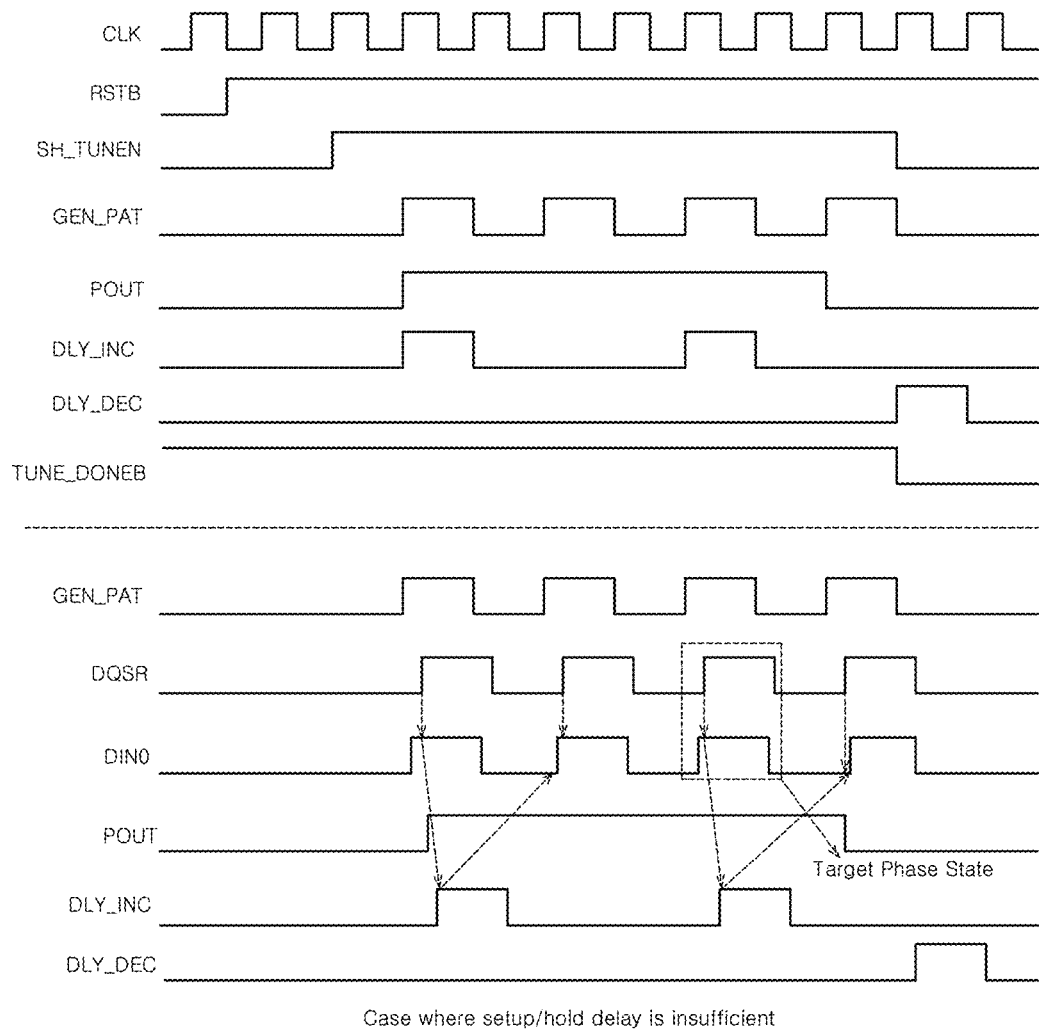

FIGS. 4a and 4b are operation timing diagrams of the data write circuit of a semiconductor apparatus in accordance with the embodiments of the present invention.

First, referring to FIG. 4a, description will be made for the case where the delay of the data path 300, that is, the setup/hold delay of the variable delay unit 330, is longer than the delay of the data strobe signal path 200.

When the reset signal RSTB toggles to a high level, the control block 600 activates the tune enable signal SH_TUNEN at the second rising edge of the clock signal CLK after a corresponding time.

The control block 600 generates the pattern signal GEN_PAT from the rising edge of the clock signal CLK after the tune enable signal SH_TUNEN is activated.

Since the tune enable signal SH_TUNEN is activated, the pattern signal GEN_PAT is provided to the data path 300 and the data strobe signal path 200.

Thereafter, the pattern signal GEN_PAT is delayed through the data path 300 and the data strobe signal path 200, respectively, and is transferred to the data latch block 400 as the first delayed pattern signal and the second delayed pattern signal.

The data latch block 400 latches the first delayed pattern signal according to the second delayed pattern signal, and generates the latch signal POUT.

The pattern signal switching block 500 transfers the latch signal POUT to the control block 600.

Since the delay of the data path 300 is longer than the delay of the data strobe signal path 200, the latch signal POUT has a low level.

Since the latch signal POUT has the low level, the counter control logic 820 of the tuning unit 800 generates the counter value decrease signal DLY_DEC.

By decreasing the delay of the data path 300, that is, the delay time of the variable delay unit 330, by one step according to the counter value decrease signal DLY_DEC, a unit tuning operation is completed.

Even after the unit tuning operation is performed, if the latch signal POUT has the low level, the unit tuning operation is repeated by generating again the counter value decrease signal DLY_DEC.

As the unit tuning operation is repeated, if the latch signal POUT toggles to a high level, that is, a level different from a previous level, it is meant that an entire tuning operation is completed.

If the entire tuning operation is performed as the latch signal POUT toggles to the high level, that is, the levels of the latch signal POUT latched according to the even pattern signal PAT_EV and the latch signal POUT latched according to the odd pattern signal PAT_OD are different from each other, the signal generation logic 850 of the tuning unit 800 activates the tune completion signal TUNE_DONEB.

At this time, since the register 810 of the tuning unit 800 latches the latch signal POUT corresponding to the timing of the even pattern signal PAT_EV, that is, the latch signal POUT before toggling, the output value of the latch signal POUT is retained as the low level.

Since the pulse generator 860 outputs the pulse signal of a low level according to the tune completion signal TUNE_DONEB and the register 810 outputs the signal of the low level, the counter control logic 820 does not generate the counter value decrease signal DLY_DEC any more.

Also, the tune enable signal SH_TUNEN is deactivated as the tune completion signal TUNE_DONEB is activated, and all operations of the control block 600 including the generation of the pattern signal GEN_PAT are interrupted.

As the tune enable signal SH_TUNEN is deactivated, the semiconductor apparatus performs a normal data write operation by receiving data through the plurality of pads DQ0 to DQi of all the data paths and receiving the pair of data strobe signals DQS and DQSB through the plurality of pads DQS and DQSB.

Additionally, FIG. 4A illustrates through the pattern signal GEN_PAT, the data strobe signal DQSR signal, data DIN0, the latch signal POUT, the counter value decrease signal DLY_DEC, and the counter value increase signal DLY_INC, a case where the setup/hold delay is excessive along with a target phase state.

Next, referring to FIG. 4b, description will be made for the case where the delay of the data path 300, that is, the setup/hold delay of the variable delay unit 330, is shorter than the delay of the data strobe signal path 200.

When the reset signal RSTB toggles to a high level, the control block 600 activates the tune enable signal SH_TUNEN at the second rising edge of the clock signal CLK after a corresponding time.

The control block 600 generates the pattern signal GEN_PAT from the rising edge of the clock signal CLK after the tune enable signal SH_TUNEN is activated.

Since the tune enable signal SH_TUNEN is activated, the pattern signal GEN_PAT is provided to the data path 300 and the data strobe signal path 200.

Thereafter, the pattern signal GEN_PAT is delayed through the data path 300 and the data strobe signal path 200, respectively, and is transferred to the data latch block 400 as the first delayed pattern signal and the second delayed pattern signal.

The data latch block 400 latches the first delayed pattern is signal according to the second delayed pattern signal, and generates the latch signal POUT.

The pattern signal switching block 500 transfers the latch signal POUT to the control block 600.

Since the delay of the data path 300 is shorter than the delay of the data strobe signal path 200, the latch signal POUT has a high level.

Since the latch signal POUT has the high level, the counter control logic 820 of the tuning unit 800 generates the counter value increase signal DLY_INC.

By increasing the delay of the data path 300, that is, the delay time of the variable delay unit 330, by one step according to the counter value increase signal DLY_INC, a unit tuning operation is completed.

Even after the unit tuning operation is performed, if the latch signal POUT has the high level, the unit tuning operation is repeated by generating again the counter value increase signal DLY_INC.

As the unit tuning operation is repeated, if the latch signal POUT toggles to the low level, that is, a level different from a previous level, it is meant that an entire tuning operation is completed.

If the entire tuning operation is performed as the latch signal POUT toggles to the low level, that is, the levels of the latch signal POUT latched according to the even pattern signal PAT_EV and the latch signal POUT latched according to the odd pattern signal PAT_OD are different from each other, the signal generation logic 850 of the tuning unit 800 activates the tune completion signal TUNE_DONEB.

At this time, since the register 810 of the tuning unit 800 latches the latch signal POUT corresponding to the timing of the even pattern signal PAT_EV, that is, the latch signal POUT before toggling, the output value of the latch signal POUT is retained as the high level.

Since the pulse generator 860 outputs the pulse signal of a low level according to the tune completion signal TUNE_DONEB and the register 810 outputs the signal of the high level, the counter control logic 820 additionally generates the counter value decrease signal DLY_DEC.

Therefore, by decreasing the delay of the data path 300, that is, the delay time of the variable delay unit 330, by one step, it is possible to prevent the delay time of the variable delay unit 330 from excessively increasing.

Also, the tune enable signal SH_TUNEN is deactivated as the tune completion signal TUNE_DONEB is activated, and all operations of the control block 600 including the generation of the pattern signal GEN_PAT are interrupted.

As the tune enable signal SH_TUNEN is deactivated, the semiconductor apparatus performs the normal data write operation by receiving data through the plurality of pads DQ0 to DQi of all the data paths and receiving the pair of data strobe signals DQS and DQSB through the plurality of pads DQS and DQSB.

Additionally, FIG. 4B illustrates through the pattern signal GEN_PAT, the data strobe signal DQSR signal, data DIN0, the latch signal POUT, the counter value decrease signal DLY_DEC, and the counter value increase signal DLY_INC, a case where the setup/hold delay is insufficient along with a target phase state.

FIG. 5 is a waveform diagram comparing setup/hold margins of the conventional art and the embodiment of the present invention.

(a) of FIG. 5 shows a setup/hold margin according to the conventional art, and it can be seen that a setup/hold margin varies according to a PVT variation, that is, a variation of a power supply voltage VDD.

(b) of FIG. 5 shows a setup/hold margin according to the embodiments of the present invention, and it can be seen that a setup/hold margin is constantly retained even when a PVT variation, that is, a variation of a power supply voltage VDD, occurs.

Accordingly, in the embodiments of the present invention, a setup/hold margin is constantly retained even when a PVT variation, that is, a variation of a power supply voltage VDD, occurs, so that a stable data write operation is possible.

As is apparent from the above descriptions, in the embodiments of the present invention, a stable data write is possible even when a PVT variation occurs.

While various embodiments have been described above, it will be understood to those skilled in the art that the embodiments described are by way of example only. Accordingly, the data write circuit of a semiconductor apparatus described herein should not be limited based on the described embodiments. Rather, the data write circuit of a semiconductor apparatus described herein should only be limited in light of the claims that follow when taken in conjunction with the above description and accompanying drawings.

What is claimed is:

1. A data write circuit of a semiconductor apparatus, comprising:
    a data path;
    a data strobe signal path; and
    a control block configured to vary a delay time of the data path according to a phase difference between a signal having passed through the data path and a signal having passed through the data strobe signal path.

2. The data write circuit according to claim 1, further comprising:
    a data latch block configured to latch the signal having passed through the data path in response to the signal having passed through the data strobe signal path.

3. The data write circuit according to claim 2, wherein the control block is configured to determine the phase difference between the signal having passed through the data path and the signal having passed through the data strobe signal path, by using a result of latching the signal in the data latch block.

4. The data write circuit according to claim 1, wherein the data path comprises:
- a DQ pad;
- a buffer configured to buffer a signal which is inputted through the DQ pad; and
- a variable delay unit configured to delay a signal having passed through the buffer, by a varied delay time under the control of the control block, and output a resultant signal.

5. The data write circuit according to claim 1, wherein the data strobe signal path comprises:
- a DQS pad; and
- a buffer configured to buffer a signal which is inputted through the DQS pad.

6. A data write circuit of a semiconductor apparatus, comprising:
- a data path configured to receive a pattern signal and generate a first delayed pattern signal;
- a data strobe signal path configured to receive the pattern signal and generate a second delayed pattern signal;
- a data latch block configured to latch the first delayed pattern signal in response to the second delayed pattern signal, and output a resultant signal; and
- a control block configured to generate the pattern signal, and vary a delay time of the data path according to a result of comparing phases of a latched signal of the data latch block and the pattern signal.

7. The data write circuit according to claim 6, wherein the data path comprises:
- a DQ pad;
- a buffer configured to buffer a signal which is inputted through the DQ pad;
- a multiplexer configured to selectively output an output signal of the buffer or the pattern signal; and
- a variable delay unit configured to delay an output signal of the multiplexer, by a varied delay time under the control of the control block, and output a resultant signal.

8. The data write circuit according to claim 6, further comprising:
- a plurality of data paths, each data path comprising:
- a DQ pad;
- a buffer configured to buffer a signal which is inputted through the DQ pad;
- a multiplexer configured to selectively output an output signal of the buffer; and
- a variable delay unit configured to delay an output signal of the multiplexer, by a varied delay time under the control of the control block, and output a resultant signal.

9. The data write circuit according to claim 6, wherein the data strobe signal path comprises:
- a DQS pad;
- a buffer configured to buffer a signal which is inputted through the DQS pad; and
- a multiplexer configured to selectively output an output signal of the buffer or the pattern signal.

10. The data write circuit according to claim 6, further comprising another data strobe signal path, the another data strobe signal path comprises:
- a DQS pad;
- a buffer configured to buffer a signal which is inputted through the DQS pad; and
- a multiplexer configured to selectively output an output signal of the buffer or the pattern signal,
- wherein the multiplexer of the another data strobe signal path is configured for allowing the another data strobe signal path to have the same delay as the data strobe signal path.

11. The data write circuit according to claim 6, wherein the control block comprises:
- a pattern signal generation unit configured to generate the pattern signal by using a clock signal; and
- a tuning unit configured to compare the phases of the latched signal of the data latch block and the pattern signal, and vary the delay time of the data path.

12. The data write circuit according to claim 6, wherein the control block is configured to generate a tune enable signal and generate the pattern signal in response to activation of the tune enable signal.

13. The data write circuit according to claim 12, wherein the data path is configured to receive the pattern signal in response to the activation of the tune enable signal.

14. The data write circuit according to claim 12, wherein the data strobe signal path is configured to receive the pattern signal in response to the activation of the tune enable signal.

15. The data write circuit according to claim 6, wherein the control block is configured to generate a tune enable signal and generate the pattern signal in response to activation of the tune enable signal, and is configured to generate delay control signals for varying the delay time of the data path according to a result of comparing the phases of the latched signal of the data latch block and the pattern signal.

16. The data write circuit according to claim 15, wherein the data path comprises:
- a DQ pad;
- a buffer configured to buffer a signal which is inputted through the DQ pad;
- a multiplexer configured to selectively output an output signal of the buffer or the pattern signal; and
- a variable delay unit configured to delay an output signal of the multiplexer, by a varied delay time under the control of the delay control signals, and output a resultant signal.

17. The data write circuit according to claim 15, further comprising:
- a plurality of data paths,
- each data path comprising:
- a DQ pad;
- a buffer configured to buffer a signal which is inputted through the DQ pad;
- a multiplexer configured to selectively output an output signal of the buffer; and
- a variable delay unit configured to delay an output signal of the multiplexer, by a varied delay time under the control of the delay control signals, and output a resultant signal.

18. The data write circuit according to claim 15, wherein the control block comprises:
- a pattern signal generation unit configured to generate the tune enable signal in response to a reset signal, and generate the pattern signal and an even pattern signal and an odd pattern signal which are defined by differentiating the pattern signal according to an order, by using the tune enable signal and a clock signal; and
- a tuning unit configured to compare phases of the latched signal of the data latch block and the even pattern signal and the odd pattern signal, and generate the delay control signals.

19. The data write circuit according to claim 12, further comprising:
- a pattern signal switching block configured to provide the latched signal of the data latch block to the control block when the tune enable signal is activated.

20. The data write circuit according to claim 6, wherein the control block is physically positioned between the data path and the data strobe signal path.

21. The data write circuit according to claim 8, wherein the control block is physically positioned between any one of the plurality of data paths and the data strobe signal path.

\* \* \* \* \*